United States Patent [19]
Toyoda

[11] Patent Number: 5,896,316
[45] Date of Patent: Apr. 20, 1999

[54] SEMICONDUCTOR NON-VOLATILE PROGRAMMABLE MEMORY DEVICE PREVENTING NON-SELECTED MEMORY CELLS FROM DISTURB DURING PROGRAMMABLE OPERATION

[75] Inventor: Hiroshi Toyoda, Tokyo, Japan

[73] Assignee: NEC Corporation, Tokyo, Japan

[21] Appl. No.: 09/150,189

[22] Filed: Sep. 10, 1998

[30] Foreign Application Priority Data

Sep. 11, 1997 [JP] Japan ................................ 9-246606

[51] Int. Cl.⁶ .................................................. G11C 16/04
[52] U.S. Cl. ........................ 365/185.02; 365/185.14; 365/185.15; 365/185.28
[58] Field of Search ...................... 365/185.02, 185.14, 365/185.15, 185.23, 185.24, 185.28

[56] References Cited

U.S. PATENT DOCUMENTS

5,280,446  1/1994  Ma et al. ......................... 365/185.02

*Primary Examiner*—David Nelms
*Assistant Examiner*—David Lam
*Attorney, Agent, or Firm*—Young & Thompson

[57] ABSTRACT

An electrically erasable and programmable read only memory device unavoidably creates weak electric field between control electrodes and drain nodes of non-selected floating gate type field effect transistors connected to either selected word or bit line in an erasing/programming operation; however, the direction of the electric field is changed during the erasing/programming operation so as to prevent the non-selected floating gate type field effect transistors from disturbing phenomenon.

23 Claims, 5 Drawing Sheets

SEMICONDUCTOR NON-VOLATILE PROGRAMMABLE MEMORY DEVICE PREVENTING NON-SELECTED MEMORY CELLS FROM DISTURB DURING PROGRAMMABLE OPERATION

FIELD OF THE INVENTION

This invention relates to a semiconductor non-volatile programmable memory device such as, for example, an electrically programmable read only memory device and an electrically erasable and programmable read only memory device and, more particularly, to a semiconductor non-volatile programmable memory device for preventing non-selected memory cells from disturb in a programming/erasing operation.

DESCRIPTION OF THE RELATED ART

Figure 1:
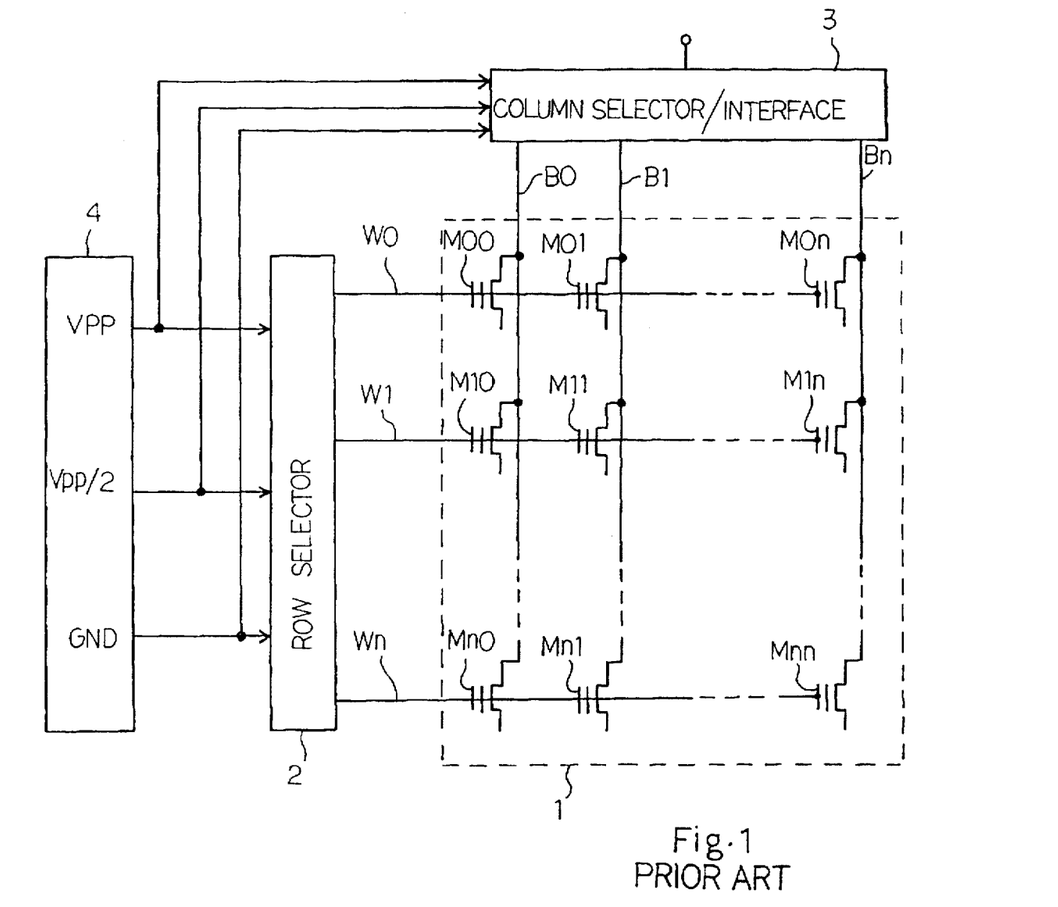
FIG. 1 is a block diagram showing the arrangement of the prior art electrically erasable and programmable read only memory device.

The electrically erasable and programmable read only memory device accumulates electric charge in and evacuates it from the floating gate electrode through a tunneling, and consumes a small amount of write-in current/erasing current. FIG. 1 illustrates a typical example of the electrically erasable and programmable read only memory device.

The prior art electrically erasable and programmable read only memory device comprises a memory cell array 1, a row selector 2 and a column selector/interface 3. Plural floating gate type field effect transistors are arranged in rows and columns, and serve as the memory cells M00-Mo1, M10-M1n, ... and Mn0-Mnn of the memory cell array 1. Plural bit lines B0, B1, ... and Bn are respectively associated with the columns of memory cells M00-Mn0, M01-Mn1, ... and M0n-Mnn, and are connected to the drain nodes of the floating gate type field effect transistors of the associated columns. Plural word lines W0, W1, ... and Wn are respectively associated with the rows of memory cells M00-M0n, M10-M1n, ... and Mn0-Mnn, and are connected to the control gate electrodes of the floating gate type field effect transistors of the associated rows. Row addresses are respectively assigned to the word lines W0-Wn, and column addresses are assigned to the bit lines B0-Bn, respectively. For this reason, every memory cell is specified by the combination of the row address and the column address.

The prior art electrically erasable and programmable read only memory device further comprises a power supply unit 4. The power supply unit 5 is connected to the row selector 2 and the column selector/interface 3, and generates high voltage VPP, middle voltage VPP/2 and ground voltage GND or zero volt. The high voltage VPP is approximately twice higher than the middle voltage VPP/2 with respect to the low voltage level GND.

The row selector 2 selectively energizes the word lines W0-Wn so as to select a row of memory cells from the memory cell array 1. The column selector 3 selectively connects the interface 3 to the bit lines B0-Bn, and the selected word line and the selected bit line specify a memory cell. The prior art electrically erasable and programmable read only memory device has a programming mode, a read-out mode and an erasing mode. The power supply unit 4 selectively supplies the high voltage VPP, the middle voltage VPP/2 and the ground voltage GND to the row selector 2 and the column selector/interface 3 depending upon the operation mode.

In the programming mode, the row selector 2 supplies the high voltage VPP to the selected word line, and the middle voltage VPP/2 to the non-selected word lines. The column selector/interface 3 supplies the ground voltage to the selected bit line, and the middle voltage VPP/2 to the non-selected bit lines. The potential difference VPP is applied between the drain node of the selected memory cell and the control gate electrode thereof, and any potential difference is not applied to the non-selected memory cells. As a result, tunneling current flows through the gate insulating layer of the selected memory cell, and electron is injected into the floating gate electrode. No tunneling current flows through the gate insulating layers of the non-selected memory cells, and a data bit of logic "1" level is written into the selected memory cell. However, the non-selected memory cells remain erased or logic "0" level.

When the selected memory cell is erased, the row selector 2 supplies ground voltage GND to the selected word line, and the middle voltage VPP/2 to the non-selected word lines. The column selector/interface 3 supplies the high voltage VPP to the selected bit line, and the middle voltage VPP/2 to the non-selected bit lines. The potential difference VPP is applied between the control gate electrode of the selected memory cell and the drain node thereof, and the accumulated electron is evacuated from the floating gate electrode to the drain node as tunneling current.

However, disturb phenomenon is unavoidable, and the electron is unintentionally accumulated in the floating gate electrode of the non-selected memory cell connected to the selected word line. Assuming now that the data bit of logic "1" level is written into the memory cell M00, the word line W0 is boosted to the high level VPP, and the bit line B0 is fixed to the ground level. The high voltage level VPP is applied to not only the control gate electrode of the memory cell M00 but also the control gate electrodes of the memory cells M00-M0n. Even though the bit lines B1 to Bn are in the middle voltage VPP/2, the potential difference VPP/2 is applied through the gate insulating layers of the non-selected memory cells M01 to M0n, and weak electric field is created across the gate insulating layers of the non-selected memory cells M01-M0n. A dispersion of carrier injection characteristics is usually observed between the memory cells M00-Mnn. If one of the non-selected memory cells M01-Mnn is too sensitive to the electric field across the gate insulating layer, the data bit of logic "1" level is mistakenly written into the non-selected memory cell.

The disturb phenomenon is also observed in the erasing mode, because the high voltage VPP and the middle voltage VPP/2 are applied to the selected bit line and the non-selected word lines. The accumulated electron is unintentionally evacuated from the floating gate electrodes of the non-selected memory cells due to the weak electric field across the gate insulating layers.

SUMMARY OF THE INVENTION

It is therefore an important object of the present invention to provide a semiconductor non-volatile programmable memory device, which prevents non-selected memory cells from the disturb phenomenon.

To accomplish the object, the present invention proposes to cancel the carrier unintentionally injected into non-selected memory cells through a weak evacuation.

In accordance with one aspect of the present invention, there is provided a semiconductor non-volatile memory device for storing data bits through a programming operation comprising a memory cell array including a plurality of memory cells each having a threshold changeable between a first threshold level representative of a first logic level of one of the data bits and a second threshold level representative of a second logic level of the one of the data bits, a carrier accumulating layer for accumulating a carrier, a first current node, a second current node spaced from the first current node by a channel region and a control node for creating an electric field extending across the carrier accumulating layer and the channel region, a plurality of word lines selectively connected to the control nodes of the plurality of memory cells, a plurality of data lines selectively connected to the first current nodes of the plurality of memory cells, and a voltage controller connected to the plurality of word lines and the plurality of data lines so as to vary a first voltage on a selected word line, a second voltage on non-selected word lines, a third voltage on a selected data line and a fourth voltage on non-selected data lines between a first time period and a second period in the programming operation, the first voltage to the fourth voltage cause the electric field to weakly accelerate the carrier from the carrier accumulating layers of the non-selected memory cells connected to the selected word line and the non-selected data lines to the non-selected data lines in the first time period, and cause the electric field to weakly accelerate the carrier from the non-selected data lines to the carrier accumulating layers of the non-selected memory cells and strongly accelerate the carrier from the selected data line to the carrier accumulating layer of the selected memory cell connected to the selected word line and the selected data line.

BRIEF DESCRIPTION OF THE DRAWINGS

The features and advantages of the semiconductor non-volatile programmable memory device will be more clearly understood from the following description taken in conjunction with the accompanying drawings in which.

DESCRIPTION OF THE PREFERRED EMBODIMENT

Figure 2:
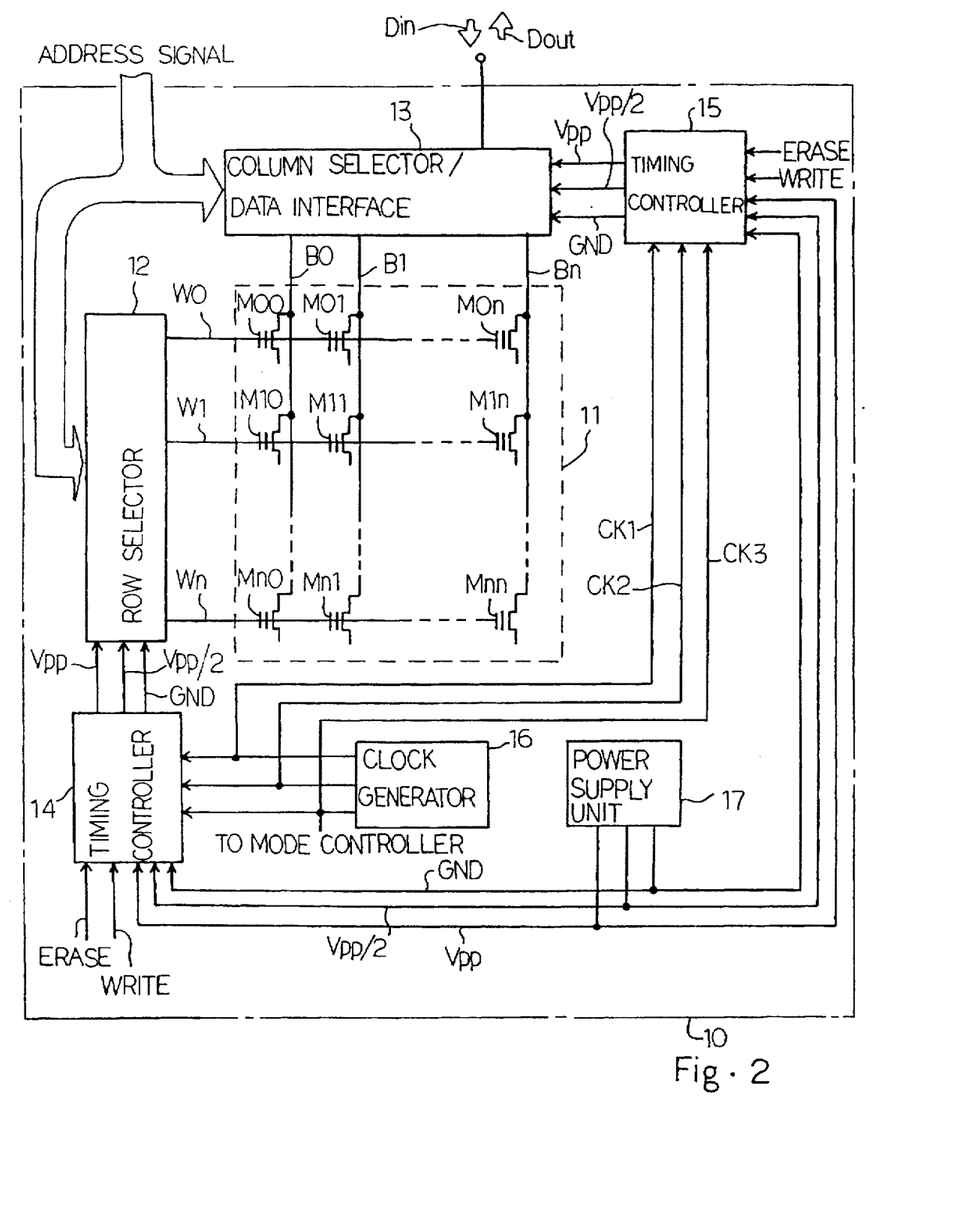
FIG. 2 is a block diagram showing the arrangement of an electrically erasable and programmable read only memory device according to the present invention.

Referring to FIG. 2 of the drawings, an electrically erasable and programmable read only memory device embodying the present invention is integrated on a semiconductor chip 10. The electrically erasable and programmable read only memory device comprises a memory cell array 11, word lines W0-Wn and bit lines B0-Bn. Plural memory cells M00-Mnn are arranged in rows and columns, and form the memory cell array 11. Each of the memory cells M00-Mnn is implemented by a floating gate type n-channel field effect transistor. The structure of the floating gate type n-channel field effect transistor is known to a person skilled in the art, and no further description is incorporated hereinbelow.

The electrically erasable and programmable read only memory device has a programming mode, a read-out mode and an erasing mode. Electron is injected into the floating gate electrodes of selected memory cells in the programming mode, and the accumulated electron changes the threshold of the selected memory cell to a high level. The high threshold level is corresponding to the data bit of logic "1" level, and the selected memory cell enters into programmed state. On the other hand, when the accumulated electron is evacuated from the floating gate electrode, the memory cell enters into erased state, and the threshold is changed to low level.

The word lines W0-Wn are associated with the rows of memory cells M00-M0n, M10-M1n, . . . And Mn0-Mnn, respectively, and are connected to the control gate electrodes of the memory cells in the associated rows. The bit lines B0-Bn are associated with the columns of memory cells M00-Mn0, M01-Mn1, . . . and M0n-Mnn, and are connected to the drain nodes of the memory cells in the associated columns. Although a source line is connected to the source nodes of the memory cells, it is not shown in FIG. 2. Row addresses are respectively assigned to the word lines W0-Wn, and column addresses are assigned to the bit lines B0-Bn, respectively. For this reason, every memory cell is specified by using the row address and the column address.

The electrically erasable and programmable read only memory device further comprises a row selector 12, a column selector/data interface 13, timing controllers 14/15, a clock generator 16 and a power supply unit 17. Though not shown in FIG. 2, a mode controller is further incorporated in the electrically erasable and programmable read only memory device, and is responsive to external control signals so as to produce internal control signals. One of the internal control signals is labeled with "WRITE", and is supplied to the timing controllers 14/15. The internal control signal WRITE is representative of the programming mode. Another internal control signal is labeled with "ERASE", and is supplied to the timing controllers 14/15. The internal control signal ERASE is representative of the erasing mode.

The power supply unit 17 generates the high voltage VPP, the middle voltage VPP/2 and the ground voltage GDN. The high voltage VPP, the middle voltage VPP/2 and the ground voltage GND are supplied to the timin, controllers 14/15. The clock generator 16 generates clock signals CK/CK2/CK3, and supplies the clock signals CK1/CK2/CK3 to the timing controllers 14/15. The clock signals CK1/CK2/CK3 are different in pulse width from one another, and the timing generators 14/15 produces a series of timings from the leading edges and the trailing edges of the clock signals CK1/CK2/CK3. The timing controllers 14/15 are responsive to the internal control signal WRITE/RRASE so as to selectively supply the high voltage VPP, the middle voltage VPP/2 and the ground voltage GND to the row selector 12 and the column selector/data interface 13 at the predetermined timings.

The row selector 12 is responsive to an address signal representative of the row address so as to select one of the word lines W0-Wn, and changes the selected word line and the non-selected word lines to appropriate voltage levels. On the other hand, the column selector/data interface 13 is responsive to another address signal representative of the column address so as to select one of the bit lines B0-Bn, and changes the selected bit line and the non-selected bit lines to appropriate voltage levels. In the read-out mode, the column selector/data interface 13 checks the potential level on the selected bit line to see whether the selected memory cell is in the programmed state or the erased state, and produces an output data signal Dout representative of the state of the selected memory cell.

The row selector 12 and the column selector/data interface 13 changes the potential level on the word lines and the potential level on the bit lines in the erasing operation/ programming operation on a selected memory cell as follows. Assuming now that the memory cell M00 is the selected memory cell, the row selector 12 and the column selector/data interface 13 selectively supply the ground voltage GND and the high voltage VPP to the word line W0 and the bit line B0, and apply potential difference equal to VPP between the control gate and the drain node. The potential difference equal to VPP creates strong electric field across the gate insulating layer of the memory cell M00, and the strong electric field causes the electron to move between the floating gate electrode and the drain node. The row selector 12 and the column selector/data interface 13 apply the middle voltage VPP/2 to the non-selected word lines W1-Wn and the non-selected bit lines B1-Bn so as to prevent the non-selected memory cells from the evacuation of the accumulated electron. Although either ground voltage GND on the selected word line W0 or high voltage level VPP on the selected bit line B0 creates weak electric field across the gate insulating layers of the non-selected memory cells connected to the selected word line W0 or the selected bit line B0, the timing controller/row selector 14/12 and the timing controller 15/column selector/data interface 15/13 stagger the timings for changing the voltage levels on the word/bit lines so as to prevent the non-selected memory cells connected to the selected word line or the selected bit line from the disturb.

Figure 3A:
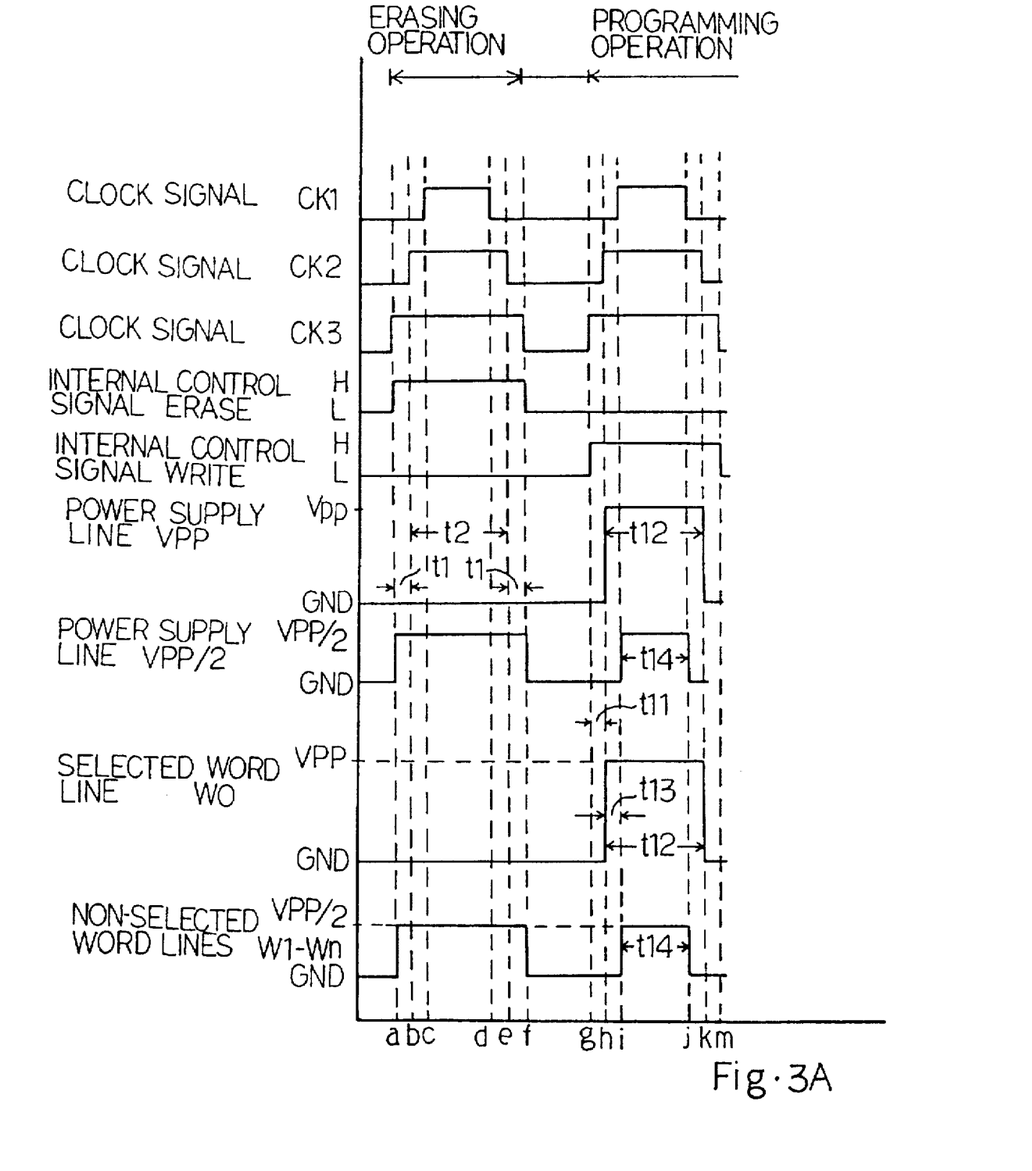
FIGS. 3A and 3B are timing charts showing an erasing operation and a programming operation of the electrically erasable and programmable read only memory device.
Figure 3B:
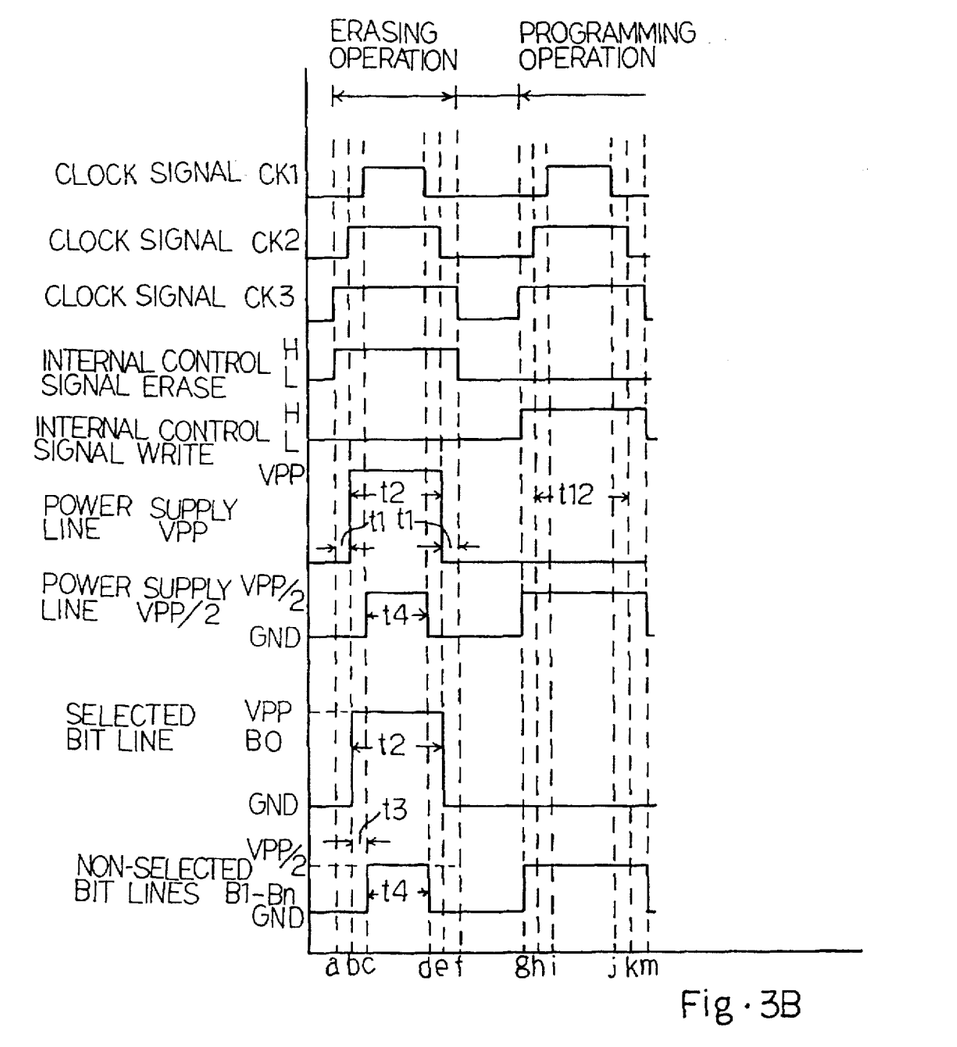

FIGS. 3A and 3b illustrate the erasing operation and the programming operation. The row address signal and the column address signal specify the memory cell B00. The electrically erasable and programmable read only memory device is assumed to enter into the erasing mode and, thereafter, the programming mode.

The erasing operation is continued from time "a" to time "f". The clock generator 16 raises the clock signal CK3 at time "a", and the mode controller (not shown) changes the internal control signal ERASE to the active high level at the leading edge of the clock signal CK3. Then, the timing controllers 14/15 acknowledge entry into the erasing mode.

The timing controller 14 supplies the middle voltage VPP/2 to the row selector 12 at the leading edge of the clock signal CK3, and the row selector 12 changes the non-selected word lines W1-Wn to the middle voltage VPP/2 at time "a". The timing controller 15 and the column selector/ data interface 13 maintain all the bit lines B0 to Bn at the ground level. For this reason, the potential difference equal to VPP/2 is applied to the non-selected memory cells M10-M1n to Mn0-Mnn. The weak electric field in the non-selected memory cells M10-M1n to Mn0-Mnn is directed to accelerate the electron toward the floating gate electrodes. The row selector 12 maintains the selected word line W0 at the ground level during the erasing operation between time "a" and time "f", and an electric field is not created in the memory cells M00-M0n.

Subsequently, the clock generator 16 raises the clock signal CK2 at time "b". Then, the timing controller 15 starts to supply the high voltage VPP to the column selector/data interface 13, and the column selector/data interface 13 changes the selected bit line B0 to the high voltage VPP at time "b". The column selector/data interface 13 maintains the selected bit line B0 at the high level VPP during time period t2 between time "b" and time "e", and potential difference equal to VPP evacuates the accumulated electron from the floating gate electrode of the selected memory cell M00. The high level VPP on the selected bit line B0 changes the direction of the weak electric field in the non-selected memory cells M10 to Mn0, and the weak electric field is directed to accelerate the electron toward the bit line B0. However, the column selector/data interface 13 maintains the non-selected bit lines B1 to Bn at the ground level. For this reason, any electric field is not created in the non-selected memory cells M0 1-M0n, and the non-selected memory cells M11-M1n to Mn1-Mnn are still under the previous weak electric field directed to accelerate the electron toward the floating gate electrode.

Subsequently, the clock generator raises the clock signal CK1 at time "c". Then, the timing controller 15 starts to supply the middle voltage VPP/2 to the column selector/data interface 13, and the column selector/data interface 13 changes the non-selected bit lines B1 to Bn to the middle voltage VPP/2 at time "c". The column selector/data interface 13 maintains the non-selected bit lines B1-Bn at the middle voltage VPP/2 during time period t4. The weak electric field directed to the bit lines B1-Bn is created in the non-selected memory cells M01-M0n, and the middle voltage VPP/2 on the non-selected bit lines B1-Bn cancels the weak electric field in the non-selected memory cells M11-M1n to Mn0-Mnn.

Subsequently, the clock signal CK1 goes down at time "d", and the timing control circuit 15 stops the middle voltage VPP/2. Then, the column selector/data interface 13 recovers the non-selected bit lines B1 to Bn to the ground level GND. Then, the non-selected memory cells M01-M0n to Mn1-Mnn return to the previous status during time period t3.

Subsequently, the clock generator 16 changes the clock signal CK2 to the low level at time "e", and the timing controller 15 stops the hiah voltage VPP. Then, the column selector/data interface 13 recovers the selected bit line B0 to the low level, and the selected memory cell M00 and the non-selected memory cells M10-Mn0 return to the previous status during the time period t1.

Finally, the clock generator chances the clock signal CK3 to the low level at time "f", and the timing controller 14 stops the middle voltage VPP/2. As a result, the row selector 12 recovers the non-selected word lines W1-Wn to the ground level GND. The mode controller recovers the internal control signal ERASE to the low level, and the electrically erasable and programmable read only memory device exits from the erasing operation.

The clock generator 16 changes the clock signal CK3 to the high level at time "g", and the mode controller changes the internal control signal WRITE to the high level. Then, the electrically erasable and programmable read only memory device enters into the programming mode. Moreover, the timing controller 15 starts to supply the middle voltage VPP/2 to the column selector/data interface 13, and the column selector/data interface 13 changes the non-selected bit lines B1 to Bn to the middle voltage VPP/2. The column selector/data interface 13 maintains the selected bit line B0 at the ground voltage during the programming operation between time "g" and time "m". The row selector 12 maintains all the word lines W0-Wn at the ground level, and the weak electric field equal to VPP/2 is created in the non-selected bit lines M01-Mn1 to M0n-Mnn, and is directed to accelerate the electron toward the bit lines B1-Bn.

After lapse of time t11, the clock generator 16 changes the clock signal CK2 to the high level, and the timing controller 14 starts to supply the middle voltage VPP/2 to the row selector 12 at time "h". Then, the row selector 12 changes the selected word line W0 to the high voltage VPP, and the strong electric field equal to VPP is created in the selected memory cell M00. Then, hot electron is accelerated toward the floating gate electrode of the selected memory cell M00, and is accumulated in the floating gate electrode. The high level on the selected word line W0 changes the direction of the weak electric field in the non-selected memory cells M01-M0n. However, the row selector 12 still maintains the non-selected word lines W1-Wn at the ground level. For this reason, the non-selected memory cells M11-M1n to Mn1-Mnn are still under the previous weak electric field directed to the bit lines B1-Bn, and any electric field is not created in the non-selected memory cells M10-Mn0. After lapse of time t13, the clock generator 16 changes the clock signal CK1 to the high level, and the timing controller 14 starts to supply the middle voltage VPP/2 to the non-selected word lines W1-Wn at time "i". The weak electric field equal to VPP/2 is created in the non-selected memory cells M10-Mn0, and is directed to accelerate the electron toward the floating gate electrodes. The middle voltage VPP/2 on the non-selected word lines W1-Wn cancels the weak electric field in the non-selected memory cells M11-M1n to Mn1-Mnn.

After lapse of time t14, the clock generator 16 changes the clock signal CK1 to the low level, and the timing controller 14 stops the middle voltage VPP/2 at time "j". The row selector 12 recovers the non-selected word lines W1-Wn to the ground level, and the non-selected memory cells M10-M1n to Mn0-Mnn return to the previous status during time period t13.

Subsequently, the clock generator 16 changes the clock signal CK2 to the low level, and the timing controller 14 stops the high voltage VOO at time "k". The row selector 12 recovers the selected word line W0 to the ground level GND, and selected memory cell M00 and the non-selected memory cells M01-M0n return to the previous status during time period t11.

Finally, the clock generator 16 changes the clock signal CK3 to the low level, and the timing controller 15 stops the middle voltage VPP/2 at time "m". The column selector/data interface 13 changes the non-selected bit lines B1-Bn to the ground level GND, and the non-selected memory cells M01-M0n to Mn1-Mnn return to the previous status before time "g". The mode controller changes the internal control signal WRITE to the low level, and the electrically erasable and programmable read only memory device exits from the programming mode.

Thus, the timing controllers 14/15 cause the row selector 12 and the column selector/data interface 13 to sequentially change the selected word line, the non-selected word lines, the selected bit line and the non-selected bit lines to the high/middle/ground voltages, and the sequential voltage control relieves the disturb.

Figure 4A:
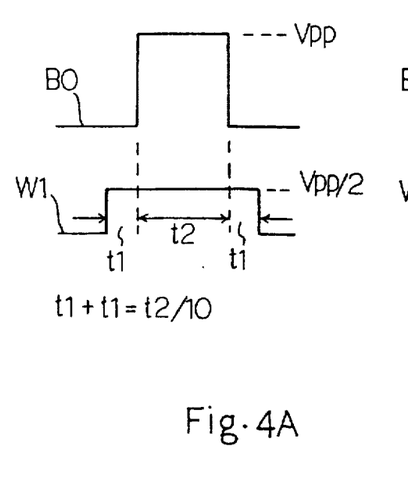
FIGS. 4A and 4B are views showing the potential level on a selected bit line and the potential level on a non-selected word line partially overlapped in an erasing operation.
Figure 4B:
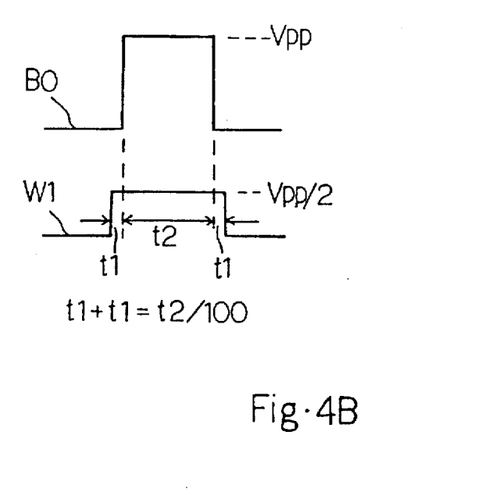

The relief of disturb is described hereinbelow in detail with reference to FIGS. 4A and 4B. In the case illustrated in FIG. 4A, the selected bit line B0 at the high voltage VPP partially overlaps with the non-selected word line W1 at the middle voltage VPP/2 during the erasing operation, and the non-overlapping time (t1+t1) is a tenth of the overlapping time t2. In the case illustrated in FIG. 4B, the selected bit line B0 at the high voltage VPP also partially overlaps with the non-selected word line W1 at the middle voltage VPP/2 during the erasing operation, and the non-overlapping time (t1+t1) is a hundredth of the overlapping time t2.

Figure 5:
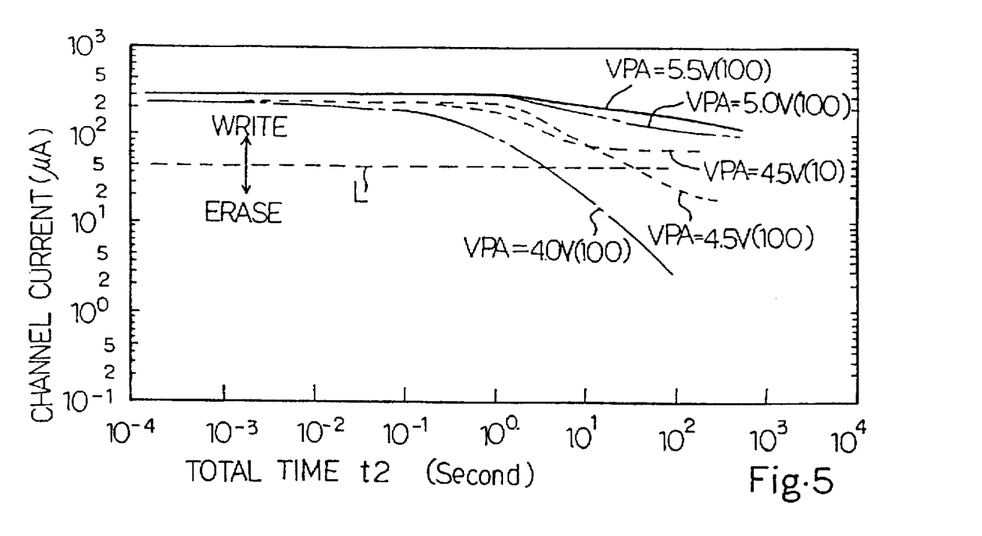
FIG. 5 is a graph showing channel current of memory cells in terms of the overlapping time between the selected bit line and the non-selected word line.

The present inventor investigated the relation between the influence of disturb and the amount of overlapping time t2. The present inventor changed the potential level on the non-selected word line W1 and the total overlapping time t2, and measured the channel current of the memory cell. The channel current was plotted in FIG. 5. In FIG. 5, "L" was indicative of a threshold between the programmed state and the erased state. In this instance, the threshold was 15 microamperes. The programmed state and the erased state were represented by "WRITE" and "ERASE", respectively. The selected bit line B0 was adjusted to 11.0 volts, and the non-selected word line W1 was varied from 4.5 volts to 5.5 volts. Plots VPA=5.5V(100) meant that the non-selected word line W1 was adjusted to 5.5 volts, and the ratio between 2t1 and t2 was 1/100 as described in conjunction with FIG. 4B. Plots VPA=5.0V(100) meant that the non-selected word line W1 was adjusted to 5.0 volts, and the ratio between 2t1 and t2 was 1/100. Plots VPA=4.5V(10) meant that the non-selected word line W1 was adjusted to 4.5 volts, and the ratio between 2t1 and t2 was 1/10 as described in conjunction with FIG. 4A. Plots VPA=4.5V (100) meant that the non-selected word line W1 was adjusted to 4.5 volts, and the ratio between 2t1 and t2 was 1/100. Plots VPA=4.0V(100) meant that the non-selected word line W1 was adjusted to 4.0 volts, and the ratio between 2t1 and t2 was 1/100.

Comparing plots VPA=4.5V(10) with plots VPA=4.5V (100), it was understood that the non-selected memory cell was free from the disturb under the ratio of 1:10.

The reason why the potential level on the non-selected word line is effective against the disturb in the erasing operation is that the electric field due to the potential level on the non-selected word line accumulates electrons the floating gate electrode of the non-selected memory cell. The accumulated electron partially cancels the evacuation of the electron under the application of the potential level to the selected bit line. This means that the strength of electric field and the ratio between the overlapping time and the non-overlapping time relate to the relief of disturb. FIG. 5 teaches that the ratio between 2t1 and t2 is varied from 1/100 to 1/10 under the strength of electric field created by the potential level on the word line between 4.5 volts and 5.0 volts.

When the selected memory cell is changed to the programmed state, the potential level on the non-selected bit line also relieves the disturb to the non-selected memory cells such as M10/M01, because the weak electric field toward the bit lines evacuate part of the accumulated electron. The time period t14 should be not shorter than the total of time periods t1/t3, i.e., (t1+t3).

In this instance, the floating gate electrode, the control gate electrode, the drain node and the source node serves as a carrier accumulating layer, a control node, a drain node and a source node, respectively. The timing controllers 14/15, the clock generator 16, the power supply unit 17, the row selector 12 and the column selector/data interface 13 as a whole constitute a voltage controller. A first time period is representative of the total of time period t11 and time period between time "k" and time "m" is equivalent to a first time period, and a second time period is corresponding to the time period t12. p As will be appreciated from the foregoing description, the timing controllers 14/15 cause the row selector 12 and the column selector/data interface 13 to cancel or supplement the electron unintentionally injected into or unintentionally evacuated from non-selected memory cells, and the non-selected memory cells are prevented from the disturb during the erasing operation and the programming operation.

Although a particular embodiment of the present invention has been shown and described, it will be apparent to those skilled in the art that various changes and modifications may be made without departing from the spirit and scope of the present invention.

For example, the present invention is applicable to an electrically programmable read only memory device, because the disturb phenomenon takes place in the programming mode. In this instance, the data erase may be carried out through radiating ultra-violet light. The memory cell is not limited to the floating gate type field effect transistor. Any kind of transistor is available in so far as the threshold is changeable due to carrier accumulated in a layer forming part of the transistor.

The erasing operation may be carried out through source lines selectively connected to the source nodes of the floating gate type field effect transistors. In this instance, a timing controller, which is similar to the timing controller 15, makes a source selector control the source lines, and the source lines serve as the data lines.

A semiconductor non-volatile programmable read only memory device may have plural memory cell arrays. In this instance, a memory cell is selected from each memory cell array so as to concurrently write data bits into or erase the data bits from the selected memory cells.

A semiconductor non-volatile programmable read only memory device may be integrated on a semiconductor chip together with other function blocks.

What is claimed is:

1. A semiconductor non-volatile memory device for storing data bits through a programming operation, comprising:

a memory cell array including a plurality of memory cells each having a threshold changeable between a first threshold level representative of a first logic level of one of said data bits and a second threshold level representative of a second logic level of said one of said data bits, a carrier accumulating layer for accumulating a carrier, a first current node, a second current node spaced from said first current node by a channel region and a control node for creating an electric field extending across said carrier accumulating layer and said channel region;

a plurality of word lines selectively connected to the control nodes of said plurality of memory cells;

a plurality of data lines selectively connected to the first current nodes of said plurality of memory cells; and a voltage controller connected to said plurality of word lines and said plurality of data lines so as to vary a first voltage on a selected word line, a second voltage on non-selected word lines, a third voltage on a selected data line and a fourth voltage on non-selected data lines between a first time period and a second period in said programming operation, said first voltage to said fourth voltage causing said electric field to weakly accelerate said carrier from the carrier accumulating layers of the non-selected memory cells connected to said selected word line and said non-selected data lines to said non-selected data lines in said first time period, said first voltage to said fourth voltage causing said electric field to weakly accelerate said carrier from said non-selected data lines to said carrier accumulating layers of said non-selected memory cells and strongly accelerate said carrier from said selected data line to the carrier accumulating layer of the selected memory cell connected to said selected word line and said selected data line.

2. The semiconductor non-volatile memory device as set forth in claim 1, in which said first time period is divided into a first sub-time period and a second sub-time period, and said first sub-time period and said second sub-time period are provided before said second time period and after said second time period, respectively.

3. The semiconductor non-volatile memory device as set forth in claim 2, in which said carrier is electron, and said voltage controller continuously fixes said third voltage and said fourth voltage to a first level and a second level higher than said first level in said first sub-time period, said second time period and said second sub-time period, said voltage controller varying said first voltage from said first level to a third level higher than said second level between said first sub-time period and said second time period and from said third level to said first level between said second time period and said second sub-time period, said second time period being divided into a third sub-time period after said first sub-time period, a fourth sub-time period after said third sub-time period and a fifth sub-time period between said fourth sub-time period and said second sub-time period, said voltage controller maintaining said second voltage at said first level in said third sub-time period, and changing said second voltage from said first level to said second level between said third sub-time period and said fourth sub-time period and from second level to said first level between said fourth sub-time period and said fifth sub-time period.

4. The semiconductor non-volatile memory device as set forth in claim 3, in which said fourth sub-time period is equal to or greater than the total of said first sub-time period and said third sub-time period.

5. The semiconductor non-volatile memory device as set forth in claim 3, in which said third level is twice higher than said second level with respect to said first level.

6. The semiconductor non-volatile memory device as set forth in claim 5, in which said first level is a ground level.

7. The semiconductor non-volatile memory device as set forth in claim 1, in which said voltage controller further varies said first voltage level, second voltage level, said third voltage level and said fourth voltage level between a third time period and a fourth time period for an erasing operation on said selected memory cell.

8. The semiconductor non-volatile memory device as set forth in claim 7, in which said third time period is divided into a first sub-time period and a second sub-time period, and said first sub-time period and said second sub-time period are provided before said fourth time period and after said fourth time period, respectively.

9. The semiconductor non-volatile memory device as set forth in claim 8, in which said carrier is electron, and said voltage controller continuously fixes said first voltage and said second voltage to a first level and a second level higher than said first level in said first sub-time period, said fourth time period and said second sub-time period, said voltage controller varying said third voltage from said first level to a third level higher than said second level between said first sub-time period and said fourth time period and from said third level to said first level between said fourth time period and said second sub-time period, said fourth time period being divided into a third sub-time period after said first sub-time period, a fourth sub-time period after said third sub-time period and a fifth sub-time period between said fourth sub-time period and said second sub-time period, said voltage controller maintaining said fourth voltage at said first voltage level in said third sub-time period, and changing said fourth voltage from said first level to said second level between said third sub-time period and said fourth sub-time period and from second level to said first level between said fourth sub-time period and said fifth sub-time period.

10. The semiconductor non-volatile memory device as set forth in claim 9, in which said third level is twice higher than said second level with respect to said first level, and the total of said first sub-time period and said second subtime period is a tenth of said fourth time period.

11. The semiconductor non-volatile memory device as set forth in claim 10, in which said first level is a ground level.

12. The semiconductor non-volatile memory device as set forth in claim 1, in which said plurality of data lines are bit lines selectively connected to drain nodes respectively serving as said first current nodes, and said voltage controller includes:

a row selector connected to said plurality of word lines and responsive to a first address signal for varying said first voltage on said selected word line and said second voltage on said non-selected word lines, a column selector and data interface connected to said bit lines and responsive to a second address signal for varying said third voltage on said selected bit line and said fourth voltage on said non-selected bit lines, and a timing generator connected to said row selector and said column selector and data interface for defining said first time period and said second time period in said programming operation.

13. The semiconductor non-volatile memory device as set forth in claim 12, in which said timing generator divides said first time period into a first sub-time period and a second sub-time period, and said first sub-time period and said second sub-time period are provided before said second time period and after said second time period, respectively.

14. The semiconductor non-volatile memory device as set forth in claim 13, in which said carrier is electron, and said timing generator causes said column selector and data interface to continuously fix said third voltage and said fourth voltage to a first level and a second level higher than said first level in said first sub-time period, said second time period and said second sub-time period, said timing generator causing said row selector to vary said first voltage from said first level to a third level higher than said second level between said first sub-time period and said second time period and from said third level to said first level between said second time period and said second sub-time period, said timing generator dividing said second time period into a third sub-time period after said first sub-time period, a fourth sub-time period after said third sub-time period and a fifth sub-time period between said fourth sub-time period and said second sub-time period, said timing generator causing said row selector to maintain said second voltage at said first voltage level in said third sub-time period and change said second voltage from said first level to said second level between said third sub-time period and said fourth sub-time period and from second level to said first level between said fourth sub-time period and said fifth sub-time period.

15. The semiconductor non-volatile memory device as set forth in claim 14, in which said fourth sub-time period is equal to or greater than the total of said first sub-time period and said third sub-time period.

16. The semiconductor non-volatile memory device as set forth in claim 14, in which said third level is twice higher than said second level with respect to said first level.

17. The semiconductor non-volatile memory device as set forth in claim 16, in which said first level is a ground level.

18. The semiconductor non-volatile memory device as set forth in claim 12, in which said timing generator further defines a third time period and a fourth time period for an erasing operation on said selected memory cell, and causes said row selector and said column selector and data interface to vary said first voltage level, second voltage level, said third voltage level and said fourth voltage level between said third time period and said fourth time period.

19. The semiconductor non-volatile memory device as set forth in claim 18, in which said timing generator divides said third time period into a first sub-time period and a second sub-time period, and said first sub-time period and said second sub-time period are provided before said fourth time period and after said fourth time period, respectively.

20. The semiconductor non-volatile memory device as set forth in claim 19, in which said carrier is electron, and said timing generator causes said row selector to continuously fix said first voltage and said second voltage to a first level and a second level higher than said first level in said first sub-time period, said fourth time period and said second sub-time period, said timing generator causing said column selector and data interface to vary said third voltage from said first level to a third level higher than said second level between said first sub-time period and said fourth time period and from said third level to said first level between said fourth time period and said second sub-time period, said timing generator further dividing said fourth time period into a third sub-time period after said first sub-time period, a fourth sub-time period after said third sub-time period and a fifth sub-time period between said fourth sub-time period and said second sub-time period, said timing generator causing said column selector and data interface to maintain said fourth voltage at said first voltage level in said third sub-time period and change said fourth voltage from said first level to said second level between said third sub-time period and said fourth sub-time period and from second level to said first level between said fourth sub-time period and said fifth sub-time period.

21. The semiconductor non-volatile memory device as set forth in claim 20, in which said third level is twice higher than said second level with respect to said first level, and the total of said first sub-time period and said second sub-time period is a tenth of said fourth time period.

22. The semiconductor non-volatile memory device as set forth in claim 21, in which said first level is a ground level.

23. The semiconductor non-volatile memory device as set forth in claim 18, in which said timing generator includes a power supply unit generating a first level, a second level higher than said first level and a third level twice higher than said second level with respect to said first level and supplying said first level, a clock generator generating a plurality of clock signals different in pulse width from one another for defining said first time period, said second time period, said third time period and said fourth time period, a first timing controller responsive to an internal control signal representative of one of said programming operation and said erasing operation for selectively supplying said first level, said second level and said third level to said row selector in said first time period and said second time period, and a second timing generator responsive to said internal control signal for selectively supplying said first level, said second level and said third level to said column selector and data interface in said third time period and said fourth time period.

* * * * *